United States Patent
Das

(10) Patent No.: US 6,898,560 B1
(45) Date of Patent: May 24, 2005

(54) MAINTAINING A COMPUTER-GENERATED DESIGN MODEL

(75) Inventor: Jyoti Das, Boca Raton, FL (US)

(73) Assignee: SolidWorks Corporation, Concord, MA (US)

( * ) Notice: Subject to any disclaimer, the term of this patent is extended or adjusted under 35 U.S.C. 154(b) by 602 days.

(21) Appl. No.: 09/583,502

(22) Filed: May 31, 2000

Related U.S. Application Data
(60) Provisional application No. 60/137,233, filed on Jun. 2, 1999.

(51) Int. Cl.[7] ................................................ G06G 7/48
(52) U.S. Cl. ............................................ 703/7; 703/22
(58) Field of Search ..................... 703/6, 7, 22; 707/10, 707/102; 716/5; 345/419

(56) References Cited

U.S. PATENT DOCUMENTS

| | | | |
|---|---|---|---|
| 5,815,154 A | | 9/1998 | Hirschtick et al. .......... 345/853 |
| 5,995,659 A | | 11/1999 | Chakraborty et al. ....... 382/176 |
| 6,011,911 A | * | 1/2000 | Ho et al. ....................... 716/5 |
| 6,104,403 A | * | 8/2000 | Mukouchi et al. .......... 345/419 |
| 6,289,345 B1 | * | 9/2001 | Yasue .......................... 707/10 |
| 6,295,063 B1 | * | 9/2001 | Minami et al. ............. 345/419 |
| 6,557,002 B1 | * | 4/2003 | Fujieda et al. .............. 707/102 |

OTHER PUBLICATIONS

Woyak et al, "Functionality and data integration of software modules through dynamic integration", Journal of Engineering design, vol. 9, No. 2. 1998.*

Zhang et al., "The disposal to Face–based representation of design/manufacturing feature integration", ACM 1999.*

Ansaldi et al., "Geometric modeling of solid objects by using a face adjacency graph representation", ACM 1985.*

Altidis et al., "Solidworks 98Plus", Design News Apr. 1999.*

\* cited by examiner

*Primary Examiner*—Kevin J. Teska
*Assistant Examiner*—Kandasamy Thangavelu
(74) *Attorney, Agent, or Firm*—James V. Mahon; Clifford Chance US LLP

(57) ABSTRACT

Restructuring a CAD-system generated design model includes receiving at a computer a command to restructure the design model. The command to restructure indicates a desired change in a hierarchical relationship of a first subset of the model's components with respect to other model components. In accordance with the command to restructure, a new hierarchical data structure can be generated. The new hierarchical data structure identifies a new hierarchical relationship between the model components. Other relationships that are changed as a result of the command to restructure are also determined and are automatically preserved subsequent to the generation of the new hierarchical relationship.

36 Claims, 10 Drawing Sheets

MAINTAINING A COMPUTER-GENERATED DESIGN MODEL

CROSS REFERENCE TO RELATED APPLICATIONS

This application claims priority to U.S. Provisional Application No. 60/137,233 filed Jun. 2, 1999.

BACKGROUND OF THE INVENTION

Computer-aided design (CAD) software allows a user to construct and manipulate models of complex three-dimensional (3D) designs of objects. A number of different modeling techniques can be used to express an object's design. These techniques include solid modeling, wire-frame modeling, and parametric modeling. Solid modeling techniques provide for a topology and surface connectivity-based modeling paradigm. Solid modeling techniques support modeling of 3D objects as collections of interconnected edges, faces, and surfaces. Wire-frame modeling techniques, on the other hand, can be used to represent a model as a simple line drawing. Wire-frame modeling techniques may help provide for computer-efficient modeling of objects. Parametric solid modeling techniques allow a model designer to define parameters interconnecting different components of a model. Parametric modeling can facilitate propagating changes among components. CAD systems may combine these, and other, modeling techniques. For example, solid modeling and parametric modeling can be combined in CAD systems supporting parametric solid modeling.

Parametric solid models are commonly used in 3D mechanical design processes. In a 3D design process, a designer may model an object from a collection of parts. Typically, a designer constructs the parts (or obtains them from a library of pre-constructed parts) and then brings those parts together in an assembly. An assembly may contain other assemblies, referred to as subassemblies, as well as solid model parts. The solid model parts and subassemblies are referred to as the assembly's components. As a design progresses, the designer re-arranges and re-groups components, thus restructuring the assembly.

As a designer models an object, the designer may find it necessary to restructure portions of a model by, for example, inserting, deleting or rearranging assemblies. When a designer restructures an assembly, the designer may remove components from the assembly, create a new assembly in which those components are rearranged independent of the remaining original assembly, and then add the new assembly to the original remaining assembly to create the restructured model. Other CAD systems may restructure assemblies by modifying software pointers to re-order components. Still other restructuring methods may be used. In some cases, conventional restructuring methods can cause a loss of parametric references and other linkages between assembly components. Such losses can inadvertently alter characteristics of a model object, thus destroying design intent previously expressed by the designer. Manual restoration of design intent (i.e., through model repair to reconstruct references and component linkages) may be time consuming and complex (particularly where a complex assembly with numerous damaged references must be repaired).

These problems may exist with respect to positional relationships. A positional relationship is a connectivity relationship between two or more components that expresses geometric properties of component interconnections. When a designer transforms a component (e.g., translates or rotates), a CAD system can recognize that an equivalent transformation is to be applied to other positionally related components. However, in some conventional CAD systems, if a designer restructures an assembly by moving a component to a different subassembly, positional relationships (as well as other connectivity relationships) can be damaged or lost. This may occur when components belong to different branches of a hierarchical data structure defining a modeled object.

When one component in a positional relationship is moved to a different location in a data structure hierarchy, positional relationships may be broken due to changes in the hierarchical relationships of components in a model's component hierarchy. The positional relationships may be deleted or suppressed when one of the components involved is deleted. Thus, a design engineer may need to manually re-establish positional relationships by examining all components in the data structure hierarchy and searching for every positional relationship that would be modified. After deleting and reinserting the relationship, the designer may recreate those positional relationships. This process, which may involve further steps such as re-inputting data describing the relationship, can require a substantial effort. Alternatively, the designer can create the relationships after the design is complete.

Another type of component relationship is an update relationship. An update relationship creates a dependency between a dimension in one component and a dimension in another component. After a restructuring operation, update components may be moved to different subassemblies.

As is the case with positioning operations, update relationships can be severed when the assembly is restructured. A design engineer may need to tediously re-establish update relationships by manually disconnecting broken relationships between components and redefining those relationships between the components. For example, a designer may delete a former relationship between components by selecting the component and issuing a command to disconnect the relationship. The designer may then re-select the (now repositioned) component and issue a command to re-establish their relationship. Alternatively, as with positional relationships, the designer can create the relationships after the design is complete.

Advantages may be obtained by improved computer aided design and modeling techniques that permit relationships in and between models and their components to be automatically maintained during changes to the model and its components.

SUMMARY OF THE INVENTION

A computer aided design (CAD) system can be used to design a model of a real-world object from a collection of components. The components can include parts, assemblies, relationships between parts and assemblies (e.g., size and positional relationships), and other structures and relationships. Construction of the model from the components may be represented by a data structure arranging the components using a hierarchy having multiple parent-child relationships between the components. During a model design and editing process, portions of this hierarchy may be deleted, moved, supplemented, or otherwise changed. It is desirable that relationships between components are automatically maintained during such changes.

In general, in one aspect, the invention features a computer-implemented methods for restructuring a design model generated from a collection of model components.

The method includes receiving at a computer a command to restructure the design model by changing a hierarchical relationship of a first subset of model components with respect to the other components. In accordance with the command to restructure, a new hierarchical data structure (with corresponding new hierarchical relationships between components) is generated. Other relationships that are changed as a result of the command to restructure also are determined and these other relationships are updated and preserved subsequent to the generation of the new hierarchical data structure. The invention can be software-implemented using a computer system.

Implementations may include one or more of the following features. The hierarchical data structures can be formed from parent-child relationships linking a common root component with another model component. Generating the new hierarchical data structure can include changing a hierarchical path between the root component and a first subset of components. The other relationships can be, e.g., a mate relationship or an update relationship between a component in the first subset and a component outside of the first subset. Generating the new hierarchical data structure can include generating a component list that identifies a component moving to a new location. Updating the other relationships may include generating a reference list identifying the other relationships that are changed. Generating a reference list also can include associating a location code with each relationship identified in the reference list. Location codes can identify a change to an associated relationship to preserve the design intent expressed by that relationship. The first subset may be, e.g., a subassembly of the model.

Implementations may include one or more of the following advantages. Integrity of the relationships between components of a modeled object can be automatically maintained as a modeled object is edited and changed. Designers may be freed from logistic constraints that may require a designer to predetermine a final assembly structure prior to creating references between components. Designers may be freed from constraints requiring recreation of existing design intent after modifying an assembly structure.

The details of one or more embodiments of the invention are set forth in the accompanying drawings and the description below. Other features, objects, and advantages of the invention will be apparent from the description and drawings, and from the claims.

DETAILED DESCRIPTION OF THE INVENTION

Improvements in CAD system functionality can be provided by automating the maintenance of relationships between model components (which may include assemblies, subassemblies, parts, primitive operations, transformations, etc.). These improvements may be obtained through automated operations that may include reorganizing a data structure that defines relationships between components while retaining existing component relationships such that relationships between the components remain intact.

Figure 1:
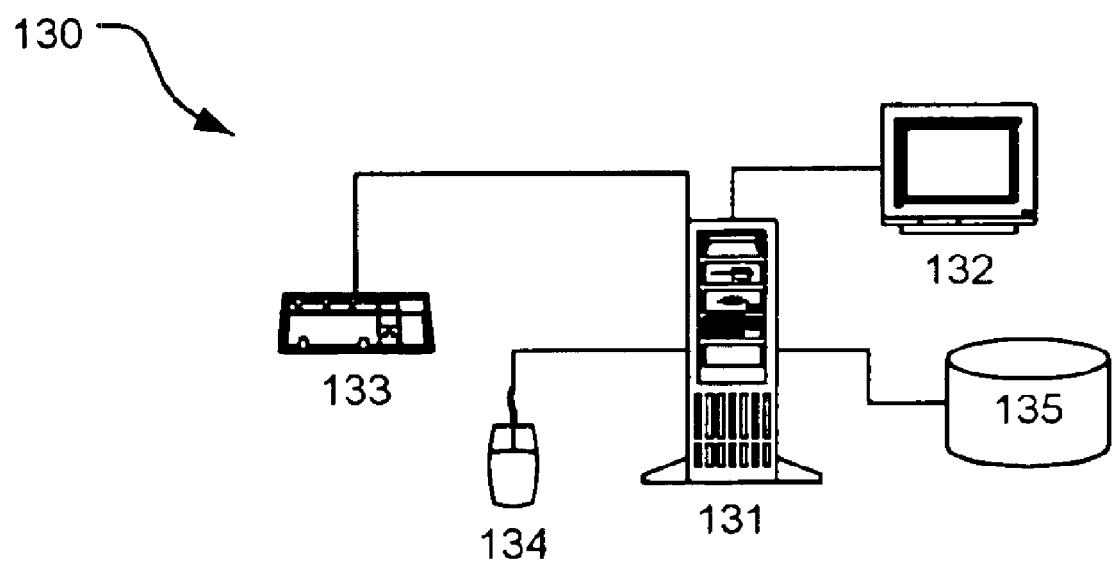
FIG. 1 is a block diagram of a computerized modeling system.

FIG. 1 shows a computerized modeling system 130 that includes a CPU 131, a CRT 132, a keyboard input device 133, a mouse input device 134, and a storage device 135. The CPU 131, CRT 132, keyboard 133, mouse 134, and storage device 135 can include commonly available computer hardware devices such as a Pentium-based computer. The mouse 134 has conventional left and right buttons that the user may press to issue a command to a software program being executed by the CPU 131. Other appropriate computer hardware platforms are suitable as will become apparent from the discussion that follows. Such computer hardware platforms are preferably capable of operating the Microsoft Window NT, Windows 95, Windows 98, or UNIX operating systems.

Computer-aided design software is stored on the storage device 135 and is loaded into and executed by the CPU 131. The software allows the user to create and modify a 3D model and implements aspects of the invention described herein. The CPU 131 uses the CRT 132 to display a 3D model and other aspects thereof as described in more detail below. A user actuates the keyboard 133 and the mouse 134 to enter and modify data for the 3D model. The CPU 131 accepts and processes input from the keyboard 133 and mouse 134. Using the 3D modeling software, the CPU 131 processes the input along with the data associated with the 3D model and makes corresponding and appropriate changes to the display on the CRT 132. It will be appreciated by those of ordinary skill in the art that the invention could also be used in conjunction with any computer-aided design software, including software used to generate two-dimensional models and software that addresses applications other than mechanical design.

Figure 2:
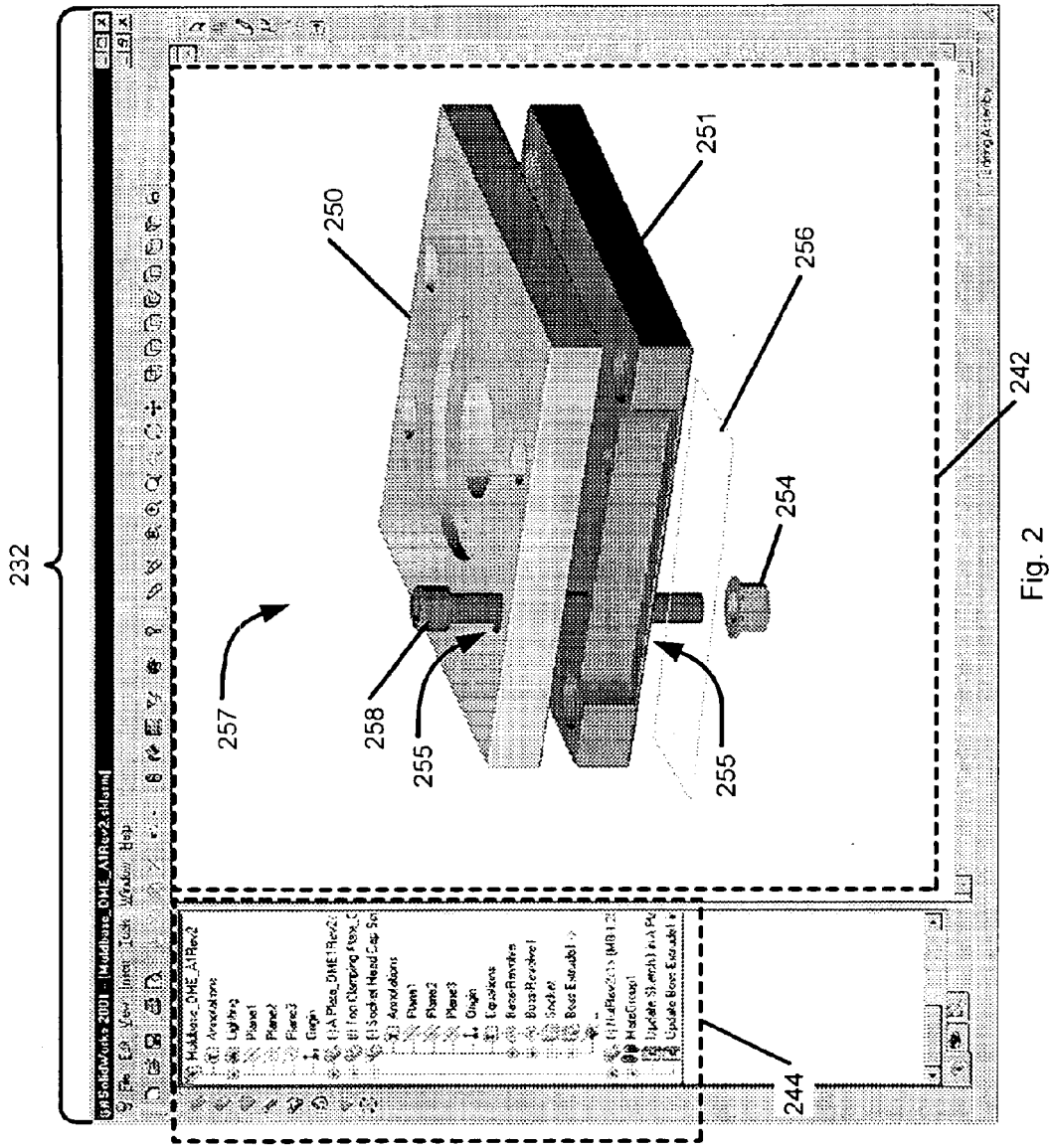
FIG. 2 shows a CRT display of the system of FIG. 1.

Referring to FIG. 2, a display on the CRT 132 is shown in detail and includes a window 232. The window 232 is a conventional screen display window that can be programmed by one of ordinary skill in the art using conventional, commercially available, software programming tools, such as those available from Microsoft Corporation of Redmond, Wash.

The window 232 includes a modeling portion 242. Implementations also may include other window areas, such as a feature manager design tree 244. The modeling portion 242 contains a 3D model 257 that can be constructed and modified by the user in a conventional manner. The 3D model 257 can be displayed using solid lines and dashed lines to show visible edges and hidden edges, respectively, of the 3D model. The feature manager design tree 244 aids visualization and manipulation of the model 257 shown in the model portion 242.

The feature manager design tree 244 may be used to display an assembly tree. An assembly tree is a visual representation of a hierarchical data structure between components in a modeled object. This hierarchical data structure may be used to control the rendering of a modeled object by the modeling software. A designer may manipulate components in the assembly tree by selecting components from the feature manager design tree 244 and shifting the components to different locations in the feature manager design tree 244.

Using this approach, the designer can reconstruct the assembly tree, and therefore, the hierarchical data structure. In some implementations, the feature manager design tree 244 may also allow selection of components by name, may be used to suppress or hide selected features, and may be used to identify and change the order in which components are rebuilt, among other tasks.

Figure 3:
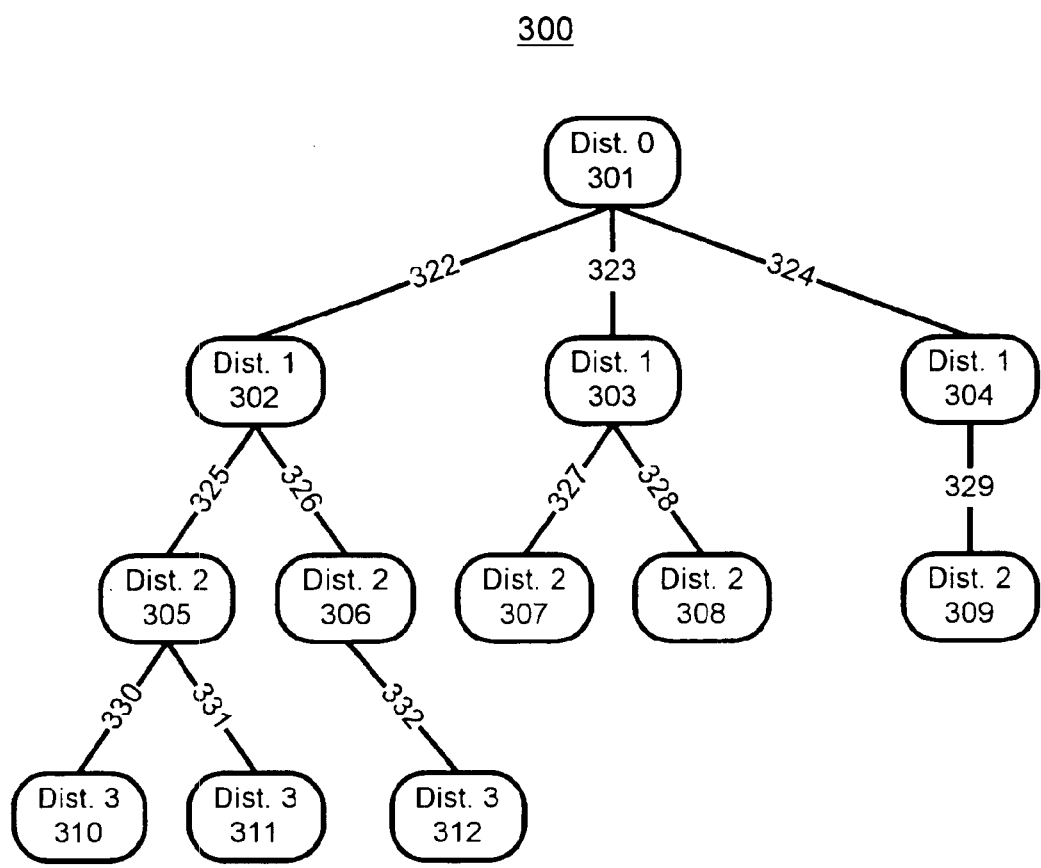
FIG. 3 is a hierarchy of nodes.

Hierarchical data structures are further explained with reference to FIG. 3. Hierarchical data structures can be used to represent software models as a combinations of primitive structures, operations, assemblies, subassemblies, and other model components. These combinations of components can be represented by a collection of nodes 301–312 interconnected in ancestor-descendent relationships. A modeled object may be represented by a root node 301 and nodes 302–312 connected to the root node. The root node 301 is an ancestor of all the other nodes 302–312 of the modeled object. Correspondingly, all other nodes 302–312 are descendents of the root node. A "descendant" node is descended from a group of ancestor nodes that includes the root node, as well as all other nodes located on paths 322–332 connecting that descendent to the root node. For example, nodes 301, 302, and 305 are ancestors of descendent nodes 310 and 311, while the remaining nodes in the structure 300 are not ancestors of node 310 or node 311. Each pair of nodes in a group of ancestor-descendents has a fixed minimum distance defined as the minimum number of connecting paths 322–332 between the nodes. Nodes separated by a distance of one are a particular type of ancestor-descendent relationship known as a parent-child relationship.

A hierarchical structure 300 can be used to define relationships between modeled components. For example, node 310 may represent a rectangular plane, node 311 may represent a cylinder, and their parent node 305 may represent a subassembly that consists of the rectangular plane and the cylinder. Thus, node 305 defines a relationship between its descendents that results in the formation of a structural component that is a subassembly. Similarly, other nodes in the hierarchy 300 define relationships between their descendents.

Modeling software can construct (or render) a modeled object by traversing ("walking") the nodes in the hierarchy 300. Walking the nodes 301–312 can include performing a breadth-first or depth-first traversal of the nodes 301–312 to locate child nodes of any given parent. The model may then be constructed by recursively performing the operations represented by the child nodes and their parents. For example, the model represented by node 301 can be constructed by (i) producing a first subassembly by combining model parts represented by nodes 310–311 according to an operation specified by their parent 305, (ii) producing a second subassembly by transforming a part represented by node 312 according to an operation represented by its parent 306, (iii) then combining the first and second subassemblies according to an operation specified by the parent 302 of nodes 305 and 306, (iv) similarly, the structures represented by nodes 303 and 304 are formed, and (v) the model is formed by combining the structures represented by nodes 302–304 according to an operation represented by the root node 301.

In modeling an object, a designer expresses "design intent" by selecting and arranging components, as well as by creating relationships between those components. Thus, a 3D model organized as an assembly captures design intent within the model by creating relationships between components. The relationships are stored as reference data structures and associated with a component or within a component in the data structure. Capturing design intent helps organize complex design processes and allows the designer to reuse components.

Figure 4:
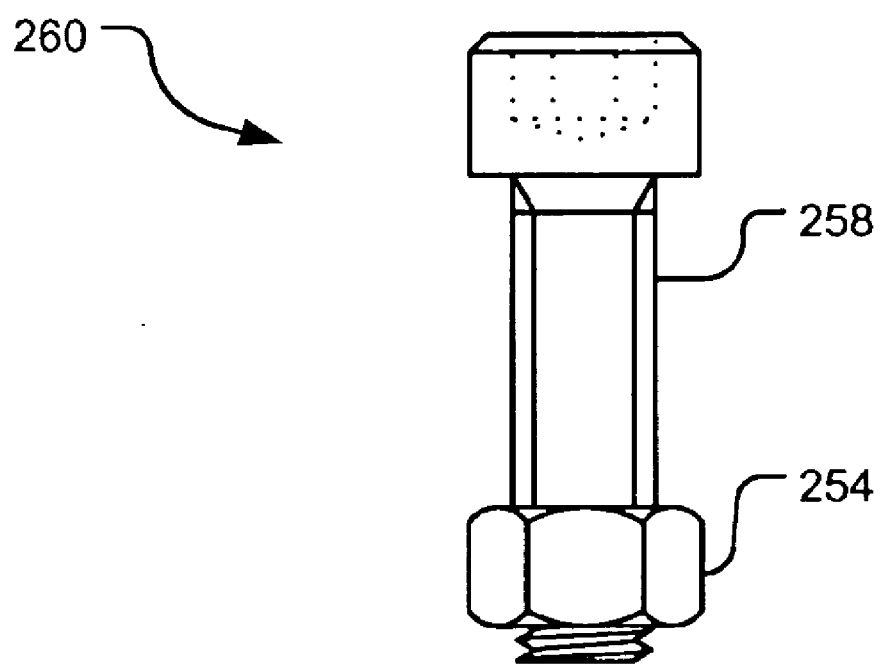
FIG. 4 is an illustration of a subassembly.

The modeled objects shown in FIGS. 2 and 4 are an example of a designer's "design intent." In this case, the "intent" of the designer is to model a pair of plates held together by a bolt passing through a hole in the plates. More particularly, FIG. 2 illustrates an assembly 257 that includes an upper plate 250 and a lower plate 251, with a hole pattern (including, among others, hole 255), a bolt 258, and a nut 254. A "design intent" associated with the assembly 257 is to align the hole pattern on the upper plate 250 and the lower plate 251, place the bolt 258 through the hole 255, and attach the nut 254. The bolt 258 should be long enough to extend beyond the lower plate 251. This is accomplished by extending the bolt 258 to a plane 256 positioned a given distance beyond the bottom of the lower plate 251. Referring to FIG. 4, to express this "intent," a designer may create a subassembly 26 that contains the bolt 258 and the nut 254. A positional relationship between the bolt 258 and the nut 254 is established by creating a "mate" reference. Additionally, a size relationship (i.e., extending the bolt to the plane 256) is established by creating an update reference. Implementations can support reuse of the bolt 258 and the nut 254 configuration by treating the subassembly 260 as a reusable structure that may be referenced by other components.

Mate references and update references can be used to capture a designer's intent to create dependent position and size relationships between components. More particularly, the design intent captured by a mate reference is the formation of a relationship between two or more components that positions the components with respect to each other. Mate references include "coincident", "distance", and other types of references. A coincident mate reference defines a plane in which each mate member is attached; as a result of this mate reference attachment, all mates move with respect to their attachment point to that plane. A distance mate reference defines how far apart the components are from one another. Distance mates are separated by a specified distance (which may be a fixed distance or may be defined relative to other model components).

An update reference exists as an external reference, meaning that the reference exists within the data structure of one component and refers to another component outside the first component. This referencing function may be implemented using, for example, a pointer structure. An update reference expresses a geometric dependency that allows one component to create (i.e., determine or set a value for), a feature in another part. One example of a feature is a dimension of a part, such as a lid for a container. An update reference between the container and lid can be used to ensure that changes in the container size results in an increase in the radius of the container's opening and is propagated between model components such that the radius of the lid is automatically resized.

Modeling systems can implement other types of references. For example, a pattern reference can be used to create an array of similar components or features; an assembly feature reference can be used to indicate that a certain feature exists only when the component is generated as part of a designated assembly; etc.

In the course of modeling an object, a designer may need to restructure assemblies (or other subdivisions) in the object's hierarchy of components. For example, assembly restructuring may occur when the designer wants to logically re-arrange the hierarchy of various components in the model or to insert a new component between existing components. As part of a restructuring process, a designer may create new subassemblies from existing components, disassociate and remove an existing subassembly, transfer components from one subassembly to another (even to the assembly itself), and dissolve a component (thereby removing the component from the structure and flattening the structure). The designer can initiate a restructuring operation using standard "drag and drop" interface techniques, or as discussed earlier, using the feature manager design tree 244.

During a restructuring process, existing references between a modeled object's assemblies, subassemblies, and other components may be changed due to the rearrangement of a model's component hierarchy. To help maintain a design of a modeled object, the system 130 can facilitate the maintenance of references between the object's components. This reference maintenance can include dynamically and interactively gathering and manipulating a collection of components that form an assembly, as well as the references within the assembly. As further discussed below, design intent can be maintained during this automatic reference maintenance by determining whether relationships of components affected by restructuring operations need to be modified. If so, appropriate modifications can be automatically made.

Figure 5:
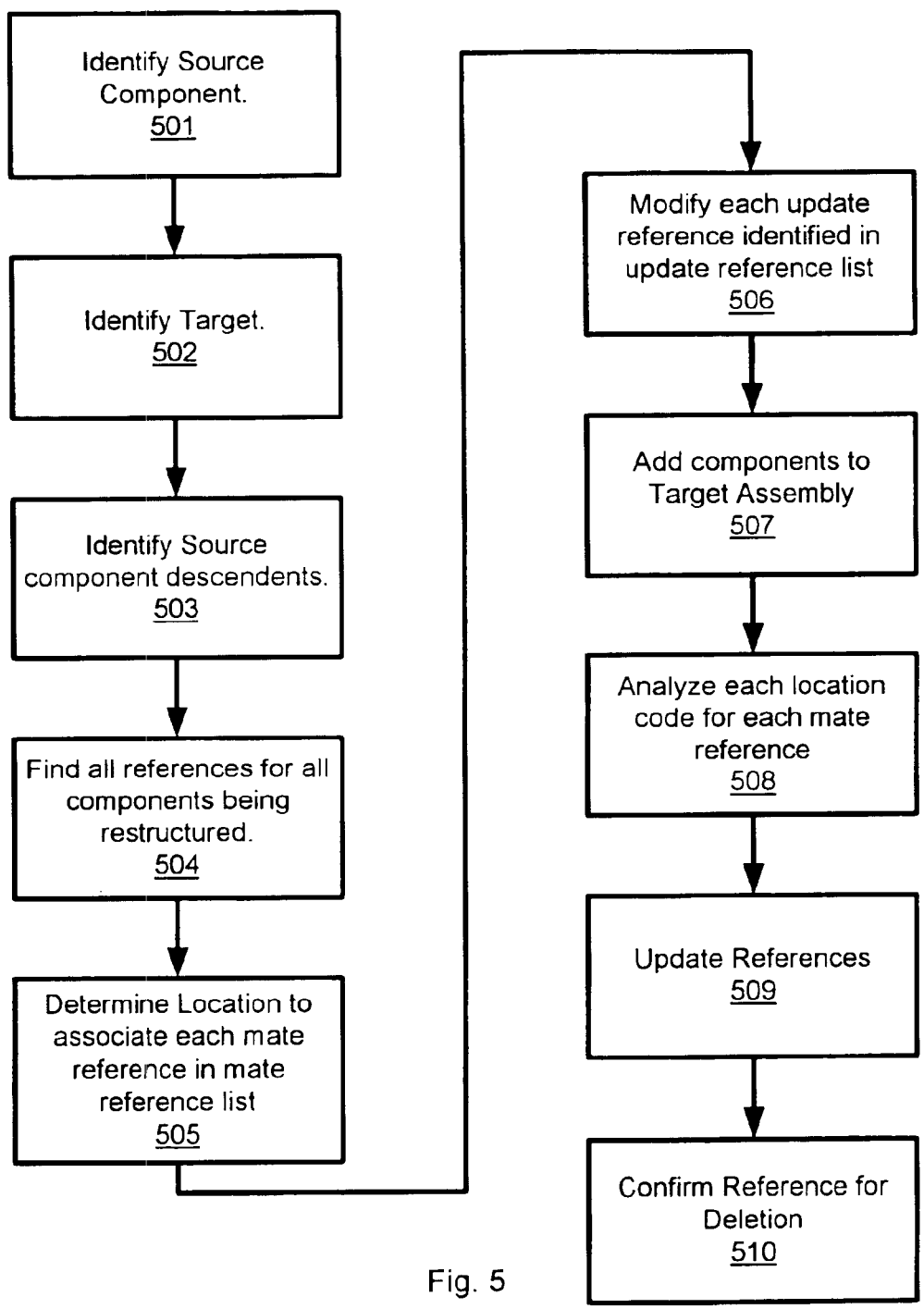
FIG. 5 is a flowchart of a process to restructure an assembly.

FIG. 5 is a flowchart of a process 500 for restructuring an assembly and automatically retaining design intent. For example purposes, the restructuring process 500 will be described with respect to the movement of a component from an initial location in a model's component hierarchy to a new position. The process 500 includes identifying the components that are to be restructured (i.e., moved). These components (the "source components") may be identified (step 501) by input received at the user interface of FIG. 2, such as by a user selection of a component (i.e., a selected source component) displayed in the feature manager design tree 244. A destination for the source components is similarly identified (step 502). This destination ("the target") may be an assembly, subassembly, or other component of a modeled object. The method 500 may identify all source components to be restructured (i.e., moved) (step 503) by analyzing the hierarchical data structure interrelating the selected source component and its descendants.

Figure 6:
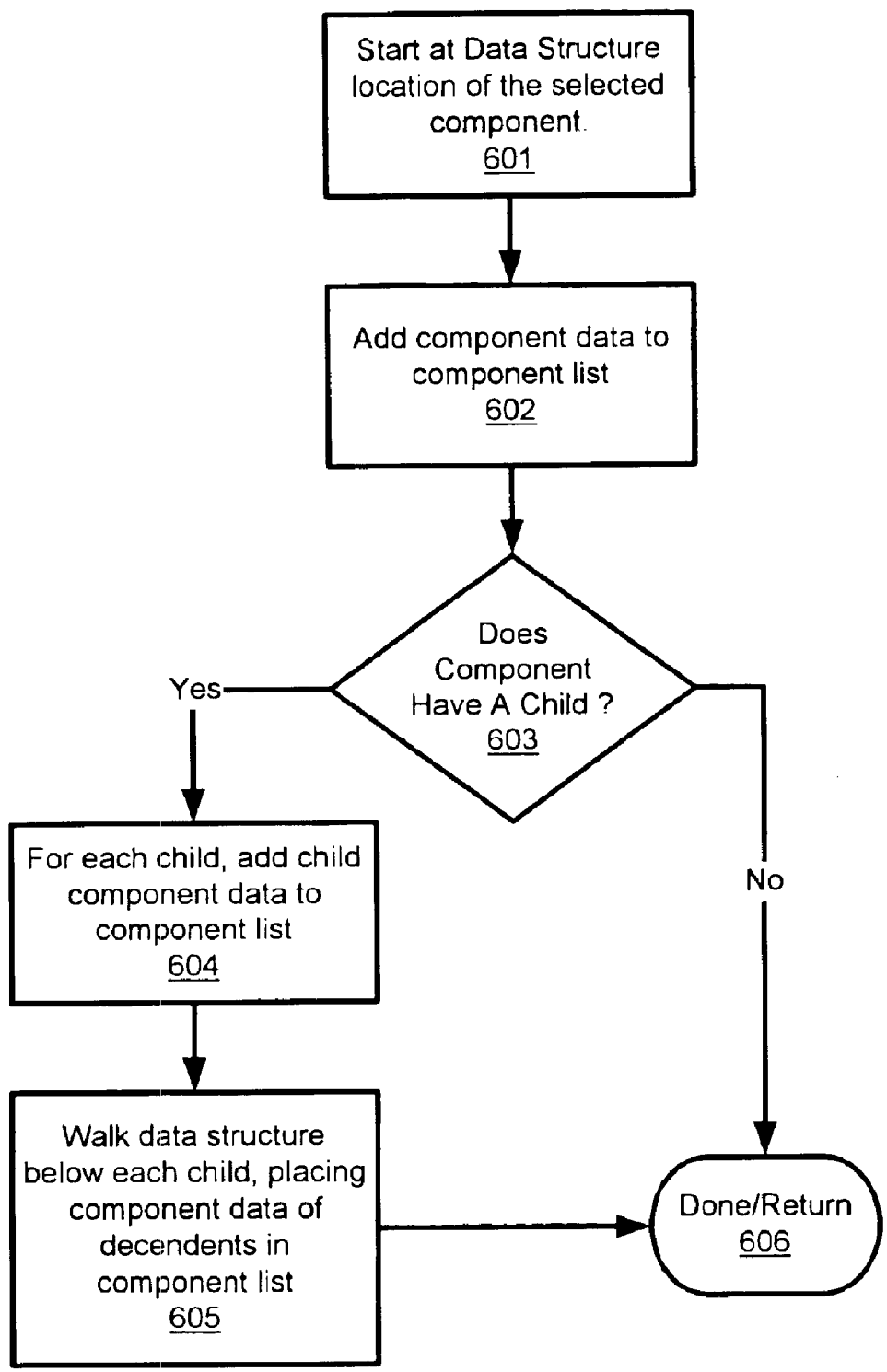
FIG. 6 is a flowchart of a process to generate a component list.

Step 503 may be performed using the process shown in FIG. 6. The process 600 analyzes the hierarchical structure of the assembly and locates all components that will move as a result of the restructuring operation. The identification process includes constructing a component list that contains component identifiers (IDs). The component list is used later to easily access the components and the data contained within the component data structures.

The process 600 begins with the addition of the selected source component's ID to the component list (steps 601–602). If the selected component does not have a child, the process 600 is complete (steps 603 and 606). If the selected component has a child then, for each child, the child ID is added to the component list (step 603–604). The process 600 then "walks" the data structure beneath each child component. The "walking" operation 605 may include recursively performing the process 600 for each child treating each child; in turn, as the "selected" node. In other words, the process 600 may include a depth-first or breadth-first search of the source component's hierarchy to add each descendant of the source component to the component list (step 605). The process 600 completes when all relevant components IDs for the source component's descendents are added to the component list (step 606). As the component list is constructed, new hierarchical paths for each source component may be calculated relative to the target component and stored in the source component's respective component list data structure. A technique for calculating a new path is to remove that portion of the path from the selected source component to the root and appending what remains to the path of the target component. The use of this new path information for maintaining references is further discussed below.

Referring back to FIG. 5 after all of the source components have been identified (step 503), all references to or from the source components and any other model components are identified and placed in one or more reference lists (step 504). These references may be identified by "walking" all components in the object's tree beginning at the object's root node or by "walking" some of the components in the object's tree in a downward direction from the root node to each source component or in an upward direction beginning at each source component and ending at the root node. A separate reference list may be constructed for each type of reference.

The process 504 includes determining appropriate hierarchical levels at which to associate mate references. Determination of the levels at which mate references are to be associated or created in the restructured object's hierarchical data structure is dependent upon the location of source components in the original component hierarchy, as well as the position that the source components will occupy with respect to the target component (i.e., the position of the source components in the restructured model hierarchy). This determination is reflected in the creation of a "mate" reference list.

To create the mate reference list, a search in the upward direction of the tree along the path from each source component to the root of a modeled object is used to determine references to any of the source components. In general, for mate references (or other references located only along a path between a given component and the root), the other paths need not be searched. In constructing the mate reference list, mate references may be associated with the least common ancestor of the source components that are referenced. Thus if a mate reference exists for a particular source component, then the mate reference for that source component is associated with a component along the path between the source component and the root of the modeled object. For update references (and other references that may be located anywhere in a model's hierarchy), an exhaustive search operation that examines every component may be required.

Figure 7:
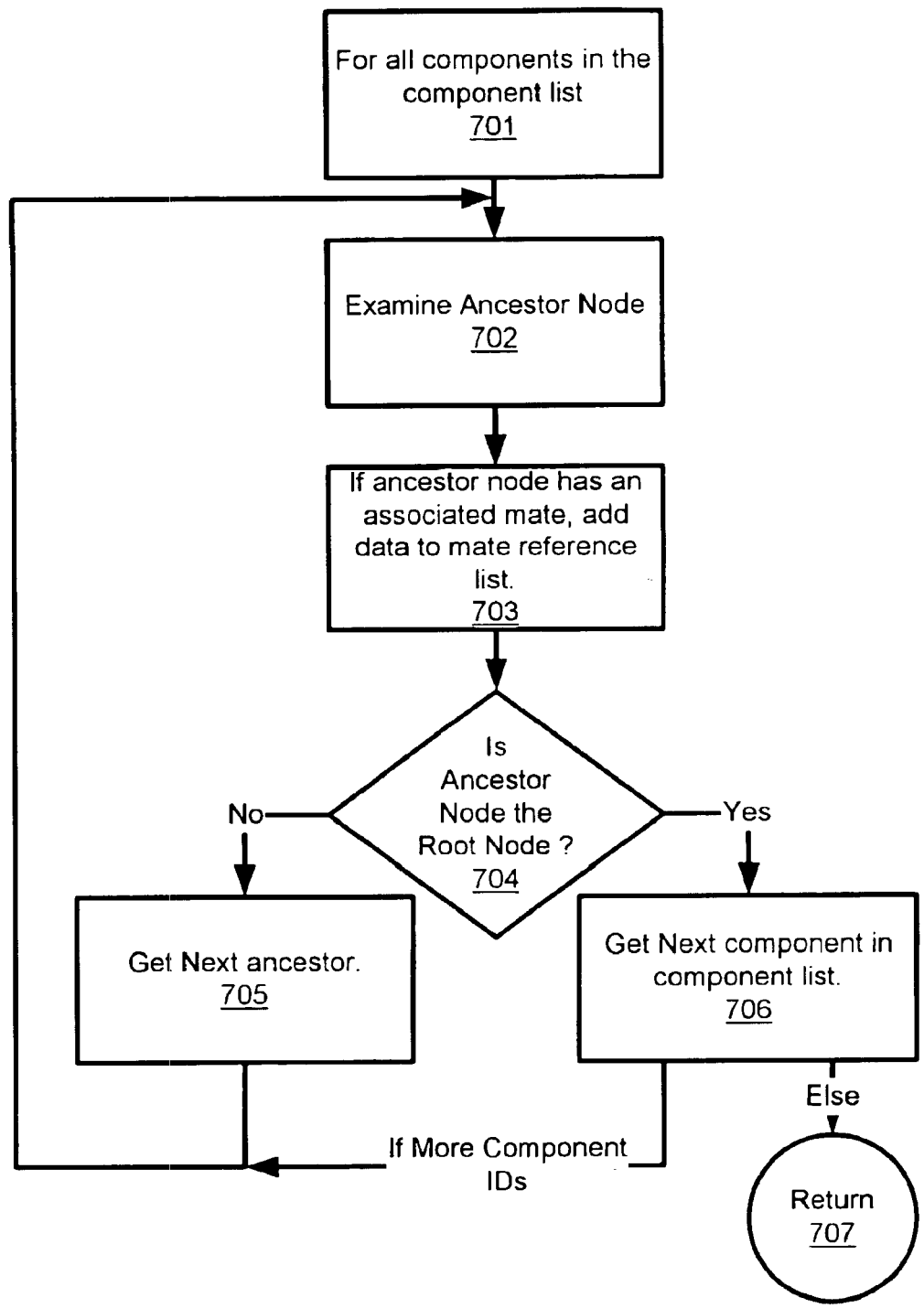
FIG. 7 is a flowchart of a process to generate a mate reference list.

FIG. 7 shows additional details for a process to construct a mate reference list 504. The process 700 locates all mate references affected by a restructuring operation and constructs the mate reference list that identifies each affected reference. The method 700 includes a search operation that may be performed for each of the source components (step 701). For each source component, the search operation 700 includes walking the modeled object's structure from the source component to the modeled object's root while examining each of the component's ancestors to locate mate references to that source component (steps 702), and if an ancestor has an associated mate reference, adds data indicating such association to the mate reference list. For each source component, the walking process continues until the root is reached (steps 704–705). When the method 700 reaches the root node, the next component identifier is read from the component list and an ancestor search is performed for that source component (step 706–702). When the entire source component list has been processed, and all ancestors of these components have been examined, the method 700 returns control to the process 500 (step 707).

Figure 8:
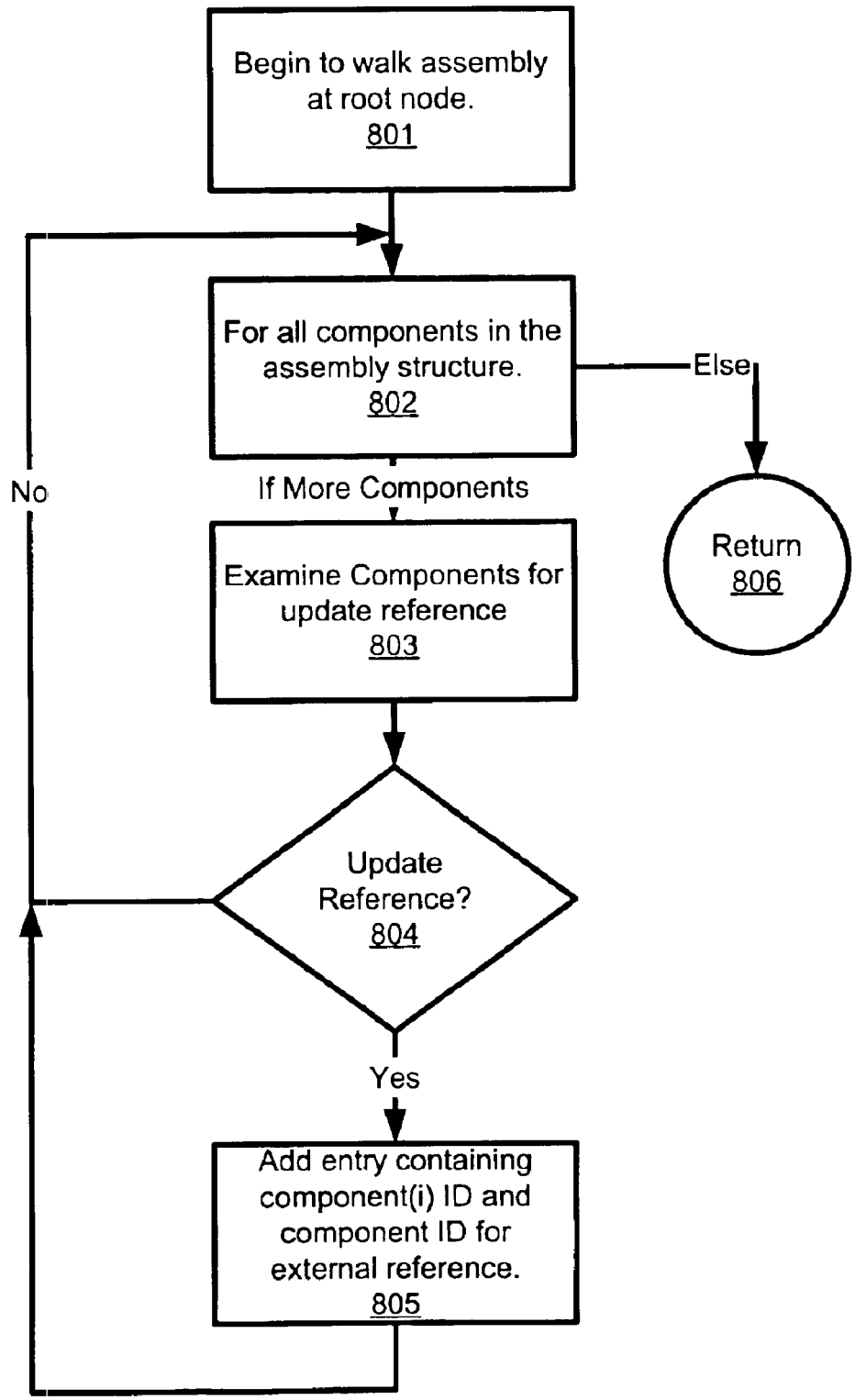
FIG. 8 is a flowchart of a process to generate an update reference list.

The process 504 also includes constructing a list of identifiers for update references. FIG. 8 shows a process 800 that can be used to construct a list of identifiers for the update references. The process 800 includes walking (e.g., using a depth-first or breadth-first search) the entire modeled objects component hierarchy starting at the root of the assembly (step 801). Each component in the hierarchy is examined to determine whether the component contains an update reference (steps 802–803). If a component has an update reference, an entry is made in the update reference list identifying both the referencing and the referenced components (steps 804–805).

Referring back to FIG. 5, for each mate reference, the method 500 determines the locations for each mate reference following the restructuring of the source components (step 505). In some implementations, references are stored in (or are an attribute of) an ancestor, component common to all of the mated components. In such implementations, processing and restructuring of the mate reference may differ depending on whether (i) the mated components are all members of the source component hierarchy (and, consequently, share a common ancestor that is also a source component) or (ii) the mated components include both source components and non-source components (and, consequently, have a common ancestor that is not a member of the source component hierarchy). In the case where all mated components are members of the source component hierarchy (case (i)), the mating reference can be stored in a source component and, consequently, will be restructured (i.e., moved) along with other components in the source component hierarchy. In the case where the mated components include components both in and out of the source component hierarchy (case (ii)), the mating reference will be stored with a common ancestor that is not a member of the source component hierarchy. In case (ii), and depending on the restructured position of the source components, the common ancestor of the mated components may change. Consequently, in case (ii), the restructuring method may need to determine a new common ancestor and to restructure the mating reference data as an attribute of that new common ancestor.

Figure 9B:
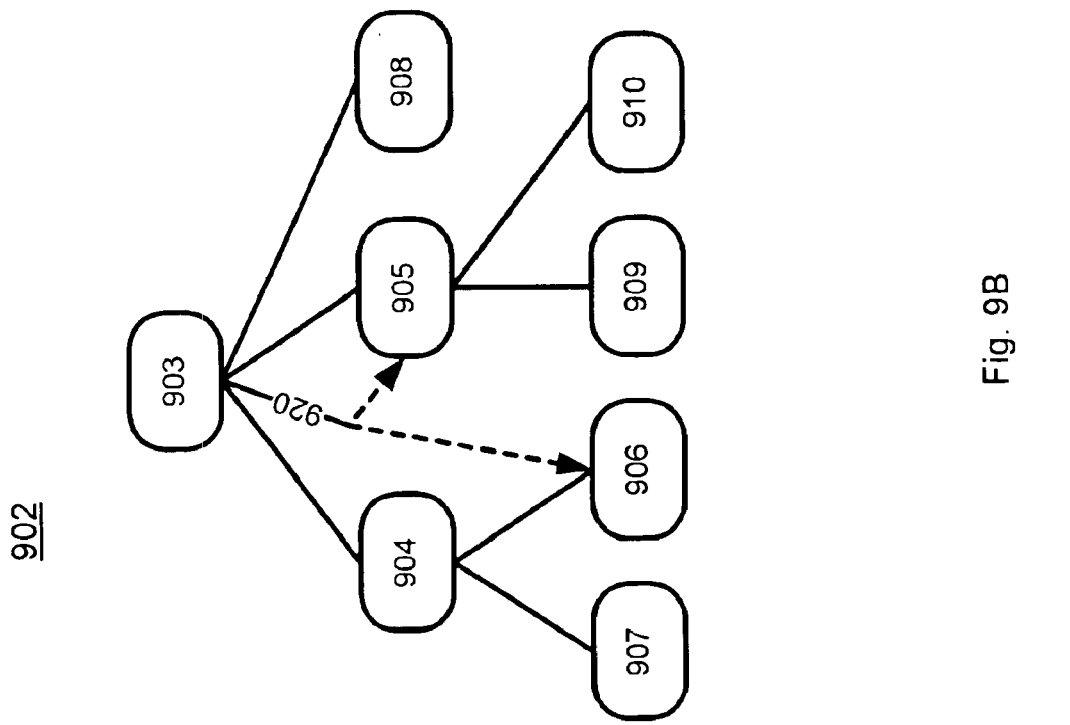
FIGS. 9A and 9B illustrate hierarchical data structures.
Figure 9A:
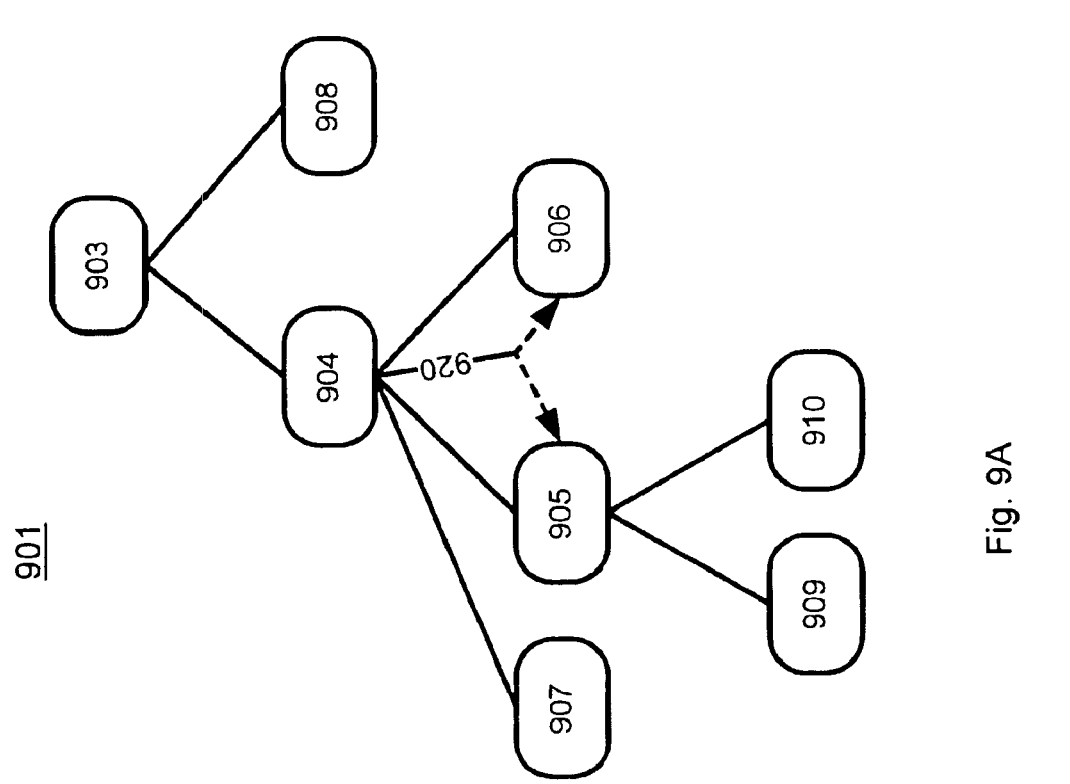

FIGS. 9A and 9B further illustrates the restructuring of mate reference data for a mate between a source component and a non-source component. FIG. 9A shows a hierarchy 901 of components 903–910 prior to a restructuring. FIG. 9B shows a hierarchy of the components 903–910 after a restructuring. Referring to FIG. 9A, the initial hierarchy 901 includes a root node 903 that has a child subassembly 904 and another component 908. In turn, subassembly 904 has three children; subassembly 905, component 906, and component 907. Subassembly 905 also has two children, components 909 and 910. In the hierarchy, 905 and 906 are mated by a mate reference 920 that is stored as an attribute of their common ancestor 904. FIG. 9B is illustrates a changed hierarchy 902 that results from a restructuring in which component 905 of FIG. 9A is selected as the "source" and moved to become a child of the target 903. After this restructuring, component 904 of FIG. 9A (which was previously associated with the mate reference between mated components 905 and 906), is no longer a common ancestor of the mated components. In such a case, a new common ancestor 903 is determined and the mate reference 920 mating components 905 and 906 is stored as an attribute of common ancestor 903.

Figure 10:
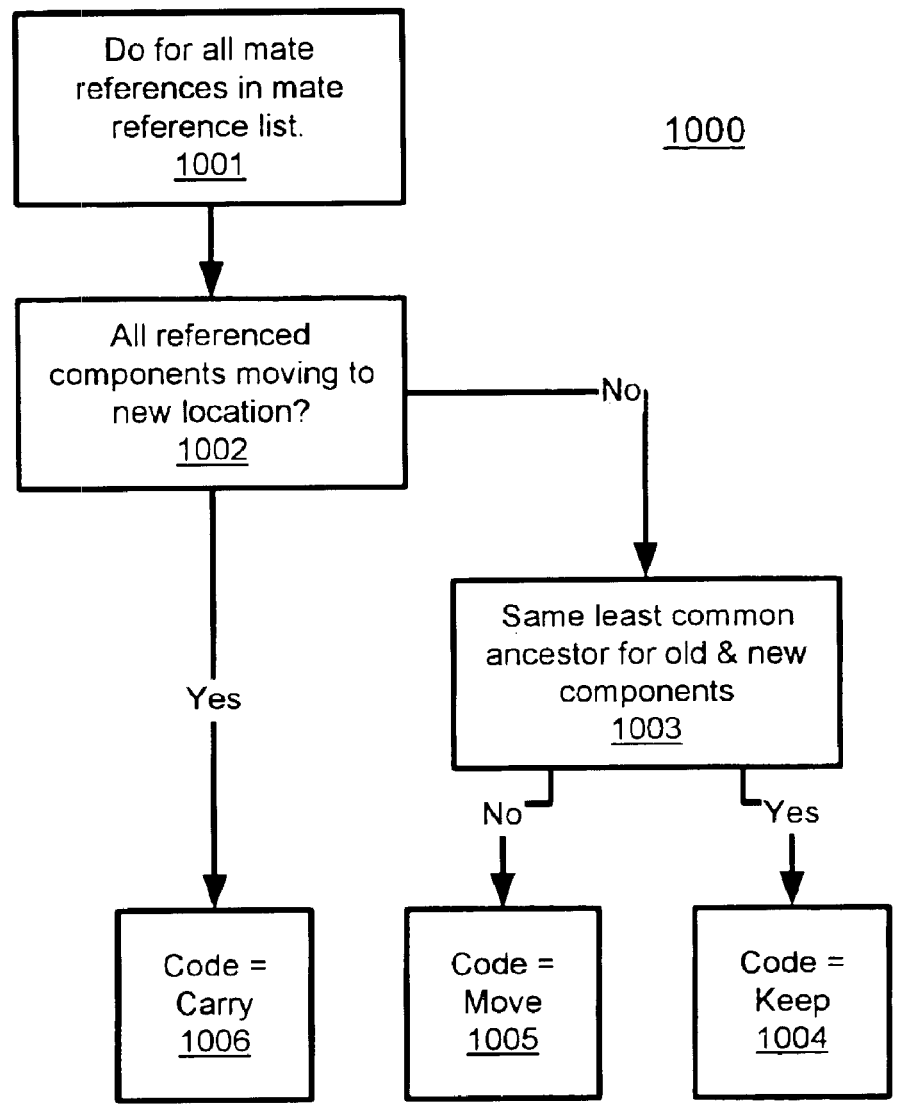
FIG. 10 is a flowchart of a process to perform maintenance tasks for mate references.

To aid in relocating mate references, codes may be assigned to the mate references during the mate reference restructuring. FIG. 10 shows a process 1000 that can be used to relocate mate reference data after source components are restructured. A reference location code may be assigned to each mate reference to indicate if and where a particular mate reference will be relocated. The reference location codes may include "Keep," "Carry," "Move," and "Delete" codes. For each mate reference in the reference list (step 1001) the process 1000 analyzes the mated components and determines whether all of the mated components are contained in the source component hierarchy (step 1002). If so, the mate reference is assigned a reference location code of "Carry" (step 1006). Otherwise, if the mated components will retain the same common ancestor after the restructuring, the mate reference is assigned a reference location code of "Keep" (steps 1003–1004). Finally, if the mated components will have a different common ancestor after the restructuring, the mate reference is assigned a reference location code of "Move" (steps 1003, 1005). Step 1003 can include accessing the previously stored data identifying each components new location in the restructured data hierarchy.

During subsequent processing of the reference list (i.e., after the assignment of the reference location codes), mate references assigned a "Keep" reference location code are not changed. References that are assigned a "Move" reference location code will move to the lowest common ancestor of the mated components in the restructured hierarchy. References that are assigned a "Carry" reference location code will be restructured in accordance with the restructuring of the source components (the restructuring of the source components will inherently determine the restructuring of the "Carry" coded references).

References may also be stored as an attribute of the referencing or referenced component (instead of being stored as an attribute of a common ancestor of the referenced components). For example, an update reference may be stored as an attribute of one of the referenced components. The update reference can include the location of the component containing the reference in the component hierarchy, the location of the externally referenced component in the component hierarchy, and the geometry that is referenced (e.g., edge, vertex, or face) in the externally referenced component. If the update reference is stored as an attribute of a source component, that reference is moved with the source component because the reference is inherent to the source component. Further modification of that reference also may be required where that reference refers to an external component (i.e., a component other than the source component). Modification of the update reference can include updating the location of the component containing the reference in the component hierarchy or updating the location of the externally referenced component in the component hierarchy.

As an example, consider an update reference that establishes a dimension in one component, such as the length of a bolt, dependent upon the position of a face in a plane. The update reference may store the location of the bolt in the hierarchical data structure, store the location of the plane in the hierarchical data structure, and contain a means to specify that the geometric type referred to in the externally referenced component is a face. Modification to the update reference data (FIG. 5, step 506) depends on whether (i) the component containing the reference (i.e., storing the reference as an attribute) is a source component or, (ii) the component containing the reference is a non-source component that refers to a source component. Maintenance of update reference data can distinguish these cases. In the first case (i.e., the source component contains an update reference), the data that designates the source component's location is modified in the reference to designate the new location of that source component. In the second case (i.e., when another component contains the update reference that refers to the source component), the update reference is changed to identify the new location of the source component.

Referring back to FIG. 5, restructuring of the source components (e.g., moving them to their "target" position) (step 507) may be accomplished by setting the current path of each of the source components to the new hierarchical path for that component. The method 500 may then analyzes the location codes associated with each mate reference in the mate reference list (step 508) and, as part of a reference update procedure (step 509), associates each mate reference with the appropriate component. The mate reference remains associated 115 with the same component if the location code is "Keep." In this case, nothing in the mate reference's data structure nor the associated component's data structure changes. If the location code is "Carry," the mate reference is modified to contain the new path of the source component with which the reference is associated. Although the mate remains associated with the same component, the reference must be updated to reflect the component's new location. If the location code is "Move," a common ancestor for the referenced components is determined and the reference is restructured as an attribute of that common ancestor.

In some cases a reference may need to be deleted. For example, a reference may need to be deleted if a component is removed by a dissolve operation. A confirmation dialog box may be displayed on the computer screen to allow confirmation that the reference should be deleted (step 510). If a reference involves a component that is being deleted, the reference data structure is deleted when only two components are referenced. When more than two components are referenced, the reference is modified in such a way that the deleted component is no longer a member of the reference.

The previous discussion describes references that can be associated with (i.e., attributes of) other components in the component hierarchy. Many different data structuring techniques can be used to associate references and components. For example, a mate reference association may be created by storing pointers as part of a common ancestor component's data structure. The pointers can identify the mated components by pointing to their data structures. Alternatively, a mate reference (or other reference type) can be directly inserted using a referencing component. The referencing component may be positioned as the lowest common ancestor of the components referenced. The branches that extend below the mate reference node reach the components that are referenced. As the hierarchical data structure is walked, the software determines if a node is a component (i.e., a part or a subassembly), or if the component is a reference component (e.g., a mate or other reference component), and handles that component accordingly. For example, with respect to mate references, earlier disclosure referred to locating common ancestors of mates. In an implementation using reference components, a reference components may be created in the restructured hierarchy as a "surrogate" common ancestors. The location of this "surrogate" common ancestor may be determined by locating a "true" common ancestor of the restructured components, then the "surrogate" common ancestor (which will be used to store the mating reference) can be appended as a descendent of that "true" common ancestor.

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits).

A number of embodiments of the present invention have been described. Nevertheless, it will be understood that various modifications may be made without departing from the spirit and scope of the invention. For example, although 3D modeling systems were discussed herein, the invention may be applied to 2D modeling systems. Implementations may change the order in which operations are performed. For example, in FIG. 5, operations 503 and 504 may be performed immediately after operation 501 and then followed by operation 502. Depending on the needs of an implementation, particular operations described herein may be implemented as a combined operation, eliminated, added to, or otherwise rearranged. Accordingly, other embodiments are within the scope of the following claims.

What is claimed is:

1. A computer-implemented method for restructuring a design model generated by a computer aided design system, the method comprising:

receiving at a computer a command to restructure the design model, the design model comprising a first hierarchical data structure interrelating a plurality of components and the command to restructure comprising a command to change a hierarchical relationship of a first subset of the plurality of components with respect to other ones of the plurality of components;

in accordance with the command to restructure, generating a new hierarchical data structure comprising a new hierarchical relationship between the plurality of model components;

determining other relationships between components in the first hierarchical data structure to change as a result of the command to restructure; and dynamically updating the other relationships to preserve the other relationships subsequent to the generation of the new hierarchical relationship.

2. The method of claim 1 wherein the first hierarchical data structure comprises a plurality of parent-child relationships relating the plurality of components to a common root component, said parent-child relationships detailing a construction of the design model.

3. The method of claim 2 wherein generating the new hierarchical data structure comprises changing a first hierarchical path between the first subset of the plurality of components and the root component.

4. The method of claim 3 wherein:
the other ones of the plurality of components comprises a first other component;
the other relationships comprise a first other relationship between one of the first subset of components and the first other component; and
a second hierarchical path between the root component and the first other component is not changed as a result of the command to restructure.

5. The method of claim 4 wherein the first other relationship comprises a mate relationship and dynamically updating the other relationships comprises updating data to maintain the first other relationship between the one of the subset of components and the first other component.

6. The method of claim 5 wherein prior to receiving the command to restructure, the first subset of the plurality of components is a descendent of the first other component, and subsequent to the restructure, the first subset of the plurality of components is not a descendent of the first other component.

7. The method of claim 4 wherein the first other relationship comprises an update relationship and dynamically updating the other relationships comprises updating data to maintain the updaterelationship between the one of the first subset of the plurality of components and the first other component.

8. The method of claim 4 wherein the first other relationship establishes a size relationship between the one of the first subset of the plurality of components and the first other component.

9. The method of claim 4 wherein the first other relationship establishes a positional relationship between the one of the first subset of the plurality of components and the first other component.

10. The method of claim 1 wherein:
generating the new hierarchical data structure comprises generating a component list identifying a component moving to a new location; and
updating the other relationships comprises generating a reference list identifying the other relationships to changed.

11. The method of claim 10 wherein generating the reference list comprises associating a reference location code with each of the other relationships identified by the reference list, each reference location code identifying a means to preserve design intent associated with each of the other relationships.

12. The method of claim 1 wherein the first subset of the plurality of components comprise a subassembly of the model.

13. A computer program residing on a computer-readable medium, comprising instructions which when executed on a computer cause the computer to:
receive a command to restructure a design model generated by a computer-aided design system, the design model comprising a first hierarchical data structure interrelating a plurality of components and the command to restructure comprising a command to change a hierarchical relationship of a first subset of the plurality of components with respect to other ones of the plurality of components;
in accordance with the command to restructure, generate a new hierarchical data structure comprising a new hierarchical relationship between the plurality of components;
determine other relationships between the plurality of components in the first hierarchical data structure to change as a result of the command to restructure; and
dynamically update the other relationships to preserve the other relationships subsequent to generation of the new hierarchical data structure.

14. The computer program of claim 13 wherein the first hierarchical data structure comprises a plurality of parent-child relationships relating the plurality of components to a common root component, said parent-child relationships detailing a construction of the design model.

15. The computer program of claim 14 wherein the instructions to generate the new hierarchical data structure comprise instructions to change a first hierarchical path between the first subset of the plurality of components and the root component.

16. The computer program of claim 15 wherein:
the other ones of the plurality of components comprises a first other component;
the other relationships comprise a first other relationship between one of the first subset of the plurality of components and the first other component; and
a second hierarchical path between the root component and the first other component is not changed as a result of the restructuring command.

17. The computer program of claim 16 wherein the first other relationship comprises a mate relationship and the instructions to dynamically update the other relationships comprise instructions to update data to maintain the mate relationship between the one of the first subset of the plurality of components and the first other component.

18. The computer program of claim 17 wherein prior to receiving the command to restructure, the first subset of the plurality of components is a descendent of the first other components, and subsequent to the generation of the new hierarchical data structure, the first subset of the plurality of components is not a descendent of the first other component.

19. The computer program of claim 16 wherein the first other relationship comprises an update relationship and the instructions to dynamically update the other relationships comprises instructions to update data to maintain the update relationship between the one of the first subset of the plurality of components and the first other component.

20. The computer program of claim 16 wherein the first other relationship establishes a size relationship between the one of the first subset of the plurality of components and the first other component.

21. The computer program of claim 16 wherein the first other relationship establishes a positional relationship between the one of the first subset of the plurality of components and the first other component.

22. The computer program of claim 13 wherein:
the instructions to generate the new hierarchical data structure comprise instructions to generate a component list identifying a component moving to a new location; and
the instructions to update the other relationships comprises instructions to generate a reference list identifying the other relationships to change.

23. The computer program of claim 22 wherein the instructions to generate the reference list comprise instructions to associate a reference location code with each of the other relationships identified by the reference list, each reference location code identifying a means to preserve design intent associated with each of the other relationships.

24. The computer program of claim 13 wherein the first subset of the plurality of components comprise a subassembly of the model.

25. A computer-aided design system comprising:
- a database comprising a stored design model generated by the computer-aided design system, the design model comprising a first hierarchical data structure interrelating a plurality of components;
- an input device to exchange data with a user; and
- a processor operatively coupled to the input device, to the database, and to a data storage medium, the data storage medium comprising instructions to configure the processor to:
  - receive from the input device a command to restructure the design model;
  - in response to the command to restructure, executing instructions to generate a new hierarchical data structure comprising a new hierarchical relationship by changing a hierarchical relationship of a first subset of the plurality of components with respect to other ones of the plurality of components;
  - determine other relationships between components in the first hierarchical data structure to change as a result of the command to restructure; and
  - dynamically update the other relationships to preserve the other relationships subsequent to generation of the new hierarchical data structure.

26. The system of claim 25 wherein the first hierarchical data structure comprises a plurality of parent-child relationships relating the plurality of components to a common root component, said parent-child relationships detailing a construction of the design model.

27. The system of claim 26 wherein the instructions to generate the new hierarchical data structure comprise instructions to change a hierarchical path between the first subset of the plurality of components and the root component.

28. The system of claim 27 wherein:
- the other ones of the plurality of components comprises a first other component;
- the other relationships comprise a first other relationship between one of the first subset of the plurality of components and the first other component; and
- a second hierarchical path between the root component and the first other component is not changed as a result of the command to restructure.

29. The system of claim 28 wherein the first other relationship comprises a mate relationship and the instructions to dynamically update the other relationships comprise instructions to update the first other relationship data to maintain a mating between the one of the first subset of the plurality of components and the first other component.

30. The system of claim 29 wherein prior to the generation of the new hierarchical data structure, the first subset of the plurality of components is a descendent of the first other components, and subsequent to the generation of the new hierarchical data structure, the first subset of the plurality of components is not a descendent of the first other component.

31. The system of claim 28 wherein the first other relationship comprises an update relationship and the instructions to dynamically update the other relationships comprises instructions to update data to maintain the update relationship between the one of the first subset of the plurality of components and the first other component.

32. The system of claim 28 wherein the first other relationship establishes a size relationship between the one of the first subset of the plurality of components and the first other component.

33. The system of claim 28 wherein the first other relationship establishes a positional relationship between the one of the first subset of the plurality of components and the first other component.

34. The system of claim 25 wherein:
- the instructions to generate the new hierarchical data structure comprise instructions to generate a component list identifying a component moving to a new location; and
- the instructions to update the other relationships comprises instructions to generate a reference list identifying the other relationships to change.

35. The system of claim 34 wherein the instructions to generate the reference list comprise instructions to associate a reference location code with each of the other relationships identified by the reference list, each reference location code identifying a means to preserve design intent associated with each of the other relationships.

36. The system of claim 25 wherein the first subset of the plurality of components comprise a subassembly of the design model.

* * * * *

UNITED STATES PATENT AND TRADEMARK OFFICE
CERTIFICATE OF CORRECTION

PATENT NO. : 6,898,560 B1  Page 1 of 1
APPLICATION NO. : 09/583502
DATED : May 24, 2005
INVENTOR(S) : Das et al.

It is certified that error appears in the above-identified patent and that said Letters Patent is hereby corrected as shown below:

On Title Page, Col. 1 Item (75)
Under Inventors (75)

Kirk Haller, Acton, MA (US) should be added.
Austin O'Malley, Acton, MA (US) should be added Signed and Sealed this Nineteenth Day of September, 2006

JON W. DUDAS
*Director of the United States Patent and Trademark Office*